United States Patent [19]

Johnson et al.

[11] 4,040,877
[45] Aug. 9, 1977

[54] METHOD OF MAKING A TRANSISTOR DEVICE

[75] Inventors: Joseph E. Johnson, Churchill; John A. Ostop, Greensburg, both of Pa.

[73] Assignee: Westinghouse Electric Corporation, Pittsburgh, Pa.

[21] Appl. No.: 717,076

[22] Filed: Aug. 24, 1976

[51] Int. Cl.² ............................................. H01L 21/22
[52] U.S. Cl. ........................................ 148/187; 29/583; 148/186
[58] Field of Search .................. 148/187, 186; 29/583

[56] References Cited
U.S. PATENT DOCUMENTS

| | | | |
|---|---|---|---|
| 3,394,037 | 7/1968 | Robinson | 148/187 |
| 3,579,815 | 5/1971 | Gentry | 29/580 |
| 3,664,894 | 5/1972 | Einthoven et al. | 148/186 |
| 3,701,696 | 10/1972 | Mets | 148/175 |
| 3,806,361 | 4/1974 | Lehner | 148/175 X |
| 3,859,127 | 1/1975 | Lehner | 29/580 X |
| 3,941,625 | 3/1976 | Kennedy et al. | 148/187 |
| 3,943,013 | 3/1976 | Kennedy et al. | 148/187 |
| 3,975,221 | 8/1976 | Rodgers | 148/187 X |

*Primary Examiner*—G. Ozaki
*Attorney, Agent, or Firm*—C. L. Menzemer

[57] ABSTRACT

A plurality of discrete transistor devices are produced on a semiconductor wafer and isolated from one another by moat etching. A passivation layer is then deposited in the moats separating the discrete transistor devices. The semiconductor wafer is then scribed and broken along lines delineated by the moats. The disclosed method permits testing of each discrete transistor device prior to separation from the wafer.

6 Claims, 7 Drawing Figures

METHOD OF MAKING A TRANSISTOR DEVICE

BACKGROUND OF THE INVENTION

1. Field of the Invention:

The present invention pertains to transistor devices and particularly to a method of making a plurality of single duffused transistor devices on a single semiconductor wafer.

2. Description of the Prior Art:

At least one form of prior art involves diffusing a semiconductor wafer to form either a PNP or an NPN structure and then scribing the wafer with a glass cutter to produce a plurality of transistor chips. A problem with such a prior art method is the inability to accurately categorize the electrical characteristics of the transistors until they have been separated into chips. The present invention provides a means for isolating and passivating individual transistors while they are still an integral part of the starting wafer, thereby permitting accurate electrical testing of a plurality of transistors prior to separation of the starting wafer into discrete transistor chips.

SUMMARY OF THE INVENTION

In accordance with the present invention a plurality of transistor devices are produced on a single semiconductor wafer by performing a shallow diffusion in the wafer with dopants to produce either a PNP or an NPN transistor structure. Moats are then etched in the wafer to isolate transistors therebetween. Next, the walls of the moats are passivated and the dopants are driven to a predetermined depth in the wafer. Finally contacts are applied to portions of the wafer, so that each transistor may be tested prior to separating the wafer into discrete transistor chips.

DESCRIPTION OF THE PREFERRED EMBODIMENTS

Figure 1:
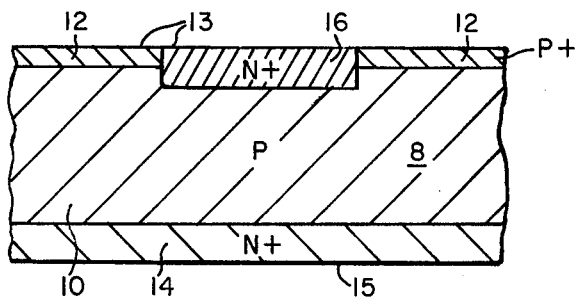
FIGS. 1-7 are cross-sectional views of a portion of a semiconductor wafer illustrating a sequence of steps in accordance with the inventive method.

FIG. 1 depicts a portion of a semiconductor wafer illustrating one of a plurality of similar transistors which are formed therein. The starting diameter of the semiconductor wafer is not critical to the invention; however, two inch diameter wafers are preferred due to ease of handling and commercial availability of two inch diameter starting material. A large number of discrete transistor chips may be formed from a single two inch diameter semiconductor wafer, the number of chips being dependent upon the size of individual chips. One transistor chip is formed in the portion of the wafer 8 shown in the figures. For purposes of illustration, FIG. 1 depicts the starting wafer 8 as P-type from which NPN transistors are produced. Those skilled in the art will recognize that PNP transistors may also be produced in accordance with these teachings by using N-type starting material. The interior portion 10 of the wafer 8 will provide a P-type base region in the final transistor device. A shallow P+ diffused region 12 is produced on at least one surface 13 as shown. A slightly deeper N+ diffusion is then performed to produce the structure of FIG. 1 by means of known diffusion and masking techniques. Along the entirety of surface 15 there is produced an N+ diffused region 14, while the other side 13 has a pattern of N+ diffused regions 16 (only one of which is shown) separated by P+ diffused regions 12. The preferred doping concentration of region 10 is from about $2 \times 10^{14}$ atoms/cm$^3$ to about $5 \times 10^{14}$ atoms/cm$^3$. Region 12 has a preferred surface concentration of about $10^{17}$ atoms/cm$^3$. Regions 14 and 16 have preferred surface concentrations of about $10^{20}$ atoms/cm$^3$.

Figure 2:
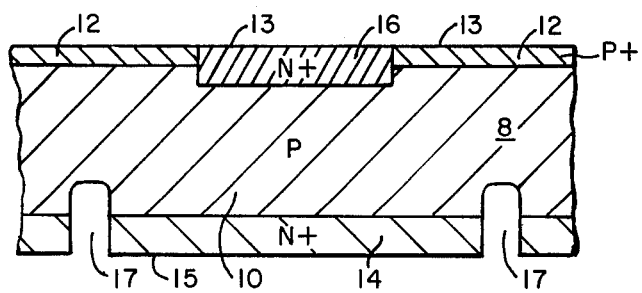

FIG. 2 illustrates the next step in the process wherein a pattern of moats 17 are etched into surface 15 to produce a plurality of N+ collector regions 14 in juxtaposition under the N+ emitter regions 16. Typically the moats are etched to form squares, which facilitates separation of the water into discrete transistor chips. The moat etch is deep enough to penetrate into P-type region 10. In a preferred device the N+ diffusion extends about 0.25 mil from surface 15. The moat etch therefore is typically about 0.50 mil in depth to assure penetrating completely through N+ layer 14. Since a typical wafer thickness is about 6 mils, the wafer is sufficiently strong to resist premature cracking along the moats. It has been found that a moat etch which penetrates into the wafer to a depth of more than about ⅓ of the wafer thickness, causes the wafer to become fragile, which results in cracking during handling.

Figure 3:
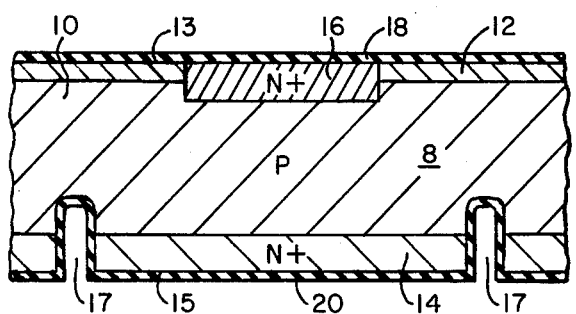

Following the moat etch step of FIG. 2, passivation layers 18 and 20 are deposited in a known manner on the exposed surfaces 13 and 15 and in the moats 17 as shown in FIG. 3. The passivation layers 18 and 20 may consist of silicon dioxide, or a combination of silicon dioxide and silicon nitride familiar to those skilled in the art. The purpose of passivation is to prevent the introduction of unwanted impurities into the wafer 8 during subsequent handling.

Figure 4:
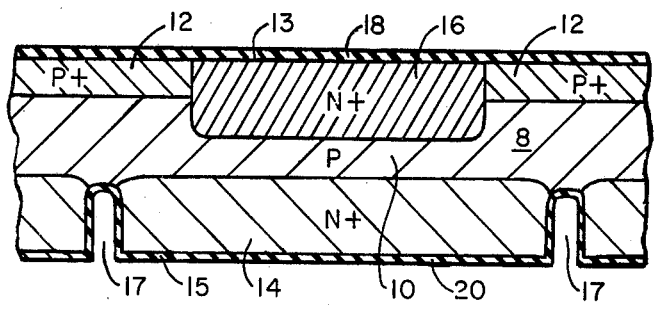

Following the passivation step, the wafer is returned to a diffusion furnace where diffused regions 12, 14 and 16 are driven to a predetermined depth in the semiconductor wafer 8 to produce the structure shown in FIG. 4. The actual depth is determined by the desired base width of region 10 as measured by the distance separating regions 14 and 16, which is selected to achieve certain electrical characteristics. Typically, N+ collector region 14 is driven to a depth of about 2½ mils which extends beyond the depth of the moats 17. During the diffusion driving step, the passivation layers act as barriers to cross-doping between the various regions. Moats 17 are sufficiently wide to prevent collector region 14 from rejoining with neighboring collector regions.

It will be readily apparent that an important feature of the present invention is the order in which the moat etching and diffusion derive steps occur. If the diffusion drive step were to precede the moat etching step, the etch depth would have to be greater than the depth of N+ region 14 shown in FIG. 4. In other words, the etch would have to be deeper than 2½ mils or about halfway through a 6 mil wafer, which would leave the wafer prone to cracking.

In accordance with the present invention, however, it is only necessary to etch to a depth which exceeds the initial shallow diffusion, which depth is much less than the critical depth of ⅓ of the wafer thickness. Thus, the wafer remains strong enough to resist cracking during subsequent handling by both machines and human operators.

Figure 5:
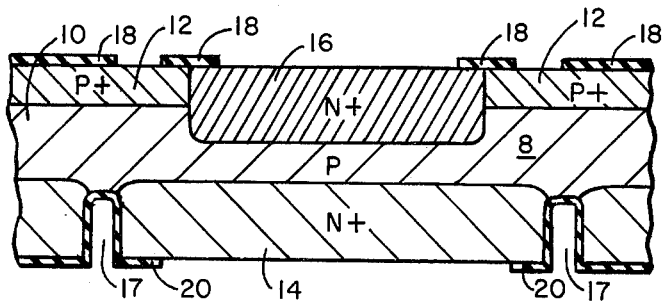

Portions of passivation layers 18 and 20 are then removed as illustrated in FIG. 5 to produce windows for contacting base region 12, emitter region 16 and collector region 14. Layers 18 and 20 may be selectively removed by etching with carbon tetrafluoride in a known manner.

Figure 6:
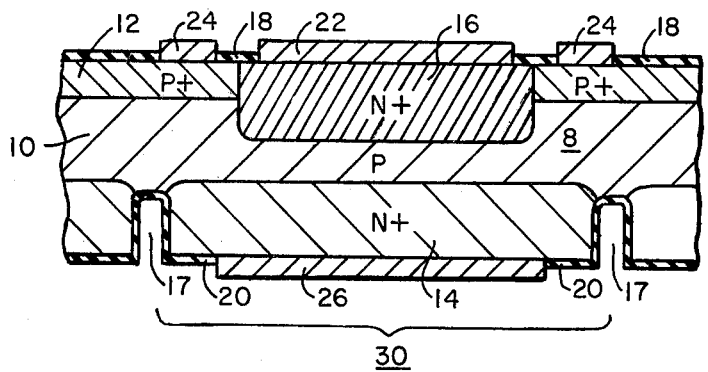

FIG. 6 depicts the wafer following a metalization step in which contacts 22, 24 and 26 are deposited on the exposed surfaces in a known manner. For example, aluminum may be deposited by vacuum deposition to form emitter contact 22 on region 16, base contact 24 on region 12 and collector contact 26 on region 14.

At this stage the wafer 8 contains a plurality of transistor devices having common base regions (FIG. 6 illustrating only one complete transistor device 30). Each transistor 30 may now be tested and categorized accordingly. For example, automated equipment is commercially available which can sequentially index each device position, make point contacts, apply a test signal, and mark each device in accordance with the test reading.

Figure 7:
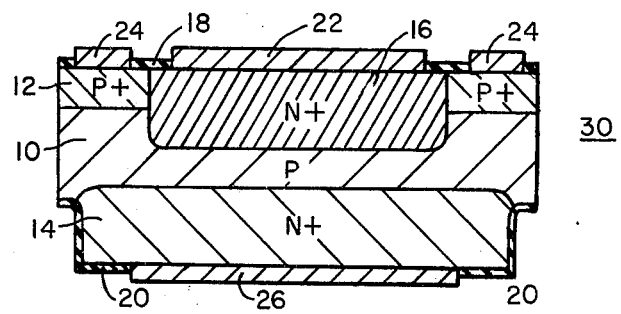

Finally, the wafer 8 is scribed and broken along the lines delineated by the moats 17 to separate the wafer 8 into a plurality of transistor chips 30 as shown in FIG. 7. Subsequent processing steps proceed in accordance with prior art practices.

It will be apparent to those skilled in the art from the foregoing description that the present invention provides a novel method of producing descrete transistor chips in a manner compatible with high volume automated processing. The present invention achieves passivation of an entire wafer containing a plurality of transistor chips as opposed to the prior art method of passivating individual transistor chips. The present invention also provides a method for separating transistors on a single wafer without etching to a depth which causes the wafer to become fragile.

What is claimed is:

1. A method of making a transistor device comprising the steps:

a. diffusing shallow regions of a first conductivity type into both sides of a semiconductor wafer of a second conductivity type,
   b. etching moats in one surface of the wafer, the moats penetrating through the shallow first conductivity type regions into the second conductivity type region to form isolated transistor portions surrounded by the moats,
   c. depositing a passivation layer on the surfaces of the semiconductor wafer,
   d. driving the first conductivity type regions to a predetermined depth in the wafer,
   e. opening windows through the passivation layer to expose surface portions for contacting the wafer, and
   f. applying metal contacts to the wafer through the windows.

2. The method of claim 1 wherein in step (c) the passivation layer comprises silicon dioxide.

3. The method of claim 1 wherein in step (c) the passivation layer comprises an underlying portion of silicon dioxide disposed on the wafer surfaces, and an outer portion of silicon nitride disposed on the silicon dioxide.

4. The method of claim 1 wherein in step (a) the shallow regions are diffused to a depth of less than ⅓ of the wafer thickness, and in step (b) the depth of moats is less than ⅓ of the wafer thickness but greater than the diffusion depth of the shallow regions.

5. The method of claim 4 wherein the depth of the shallow regions is about 0.25 mil from the wafer surface, and the depth of the moats is about 0.50 mil from the wafer surface, and the wafer is about 6 mils thick.

6. The method of claim 1 wherein the first conductivity type region has a surface concentration of about $10^{20}$ atoms/cm$^3$, and the second conductivity type region has a uniform concentration in the range from about $2 \times 10^{14}$ atoms/cm$^3$ to about $5 \times 10^{14}$ atoms/cm$^3$.

* * * * *